(12) United States Patent
Watanabe et al.

(10) Patent No.: US 11,669,011 B2
(45) Date of Patent: Jun. 6, 2023

(54) TEMPLATE, TEMPLATE MANUFACTURING METHOD, AND SEMICONDUCTOR DEVICE MANUFACTURING METHOD

(71) Applicant: Kioxia Corporation, Tokyo (JP)

(72) Inventors: Jun Watanabe, Fujisawa Kanagawa (JP); Anupam Mitra, Yokohama Kanagawa (JP); Kazuya Fukuhara, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 186 days.

(21) Appl. No.: 17/011,020

(22) Filed: Sep. 3, 2020

(65) Prior Publication Data

US 2021/0294209 A1   Sep. 23, 2021

(30) Foreign Application Priority Data

Mar. 19, 2020   (JP) .............................. JP2020-048745

(51) Int. Cl.
| | |
|---|---|
| *G03F 7/00* | (2006.01) |
| *G03F 7/20* | (2006.01) |
| *G03F 9/00* | (2006.01) |
| *H01L 21/027* | (2006.01) |
| *B29C 59/02* | (2006.01) |
| *B29C 35/08* | (2006.01) |

(52) U.S. Cl.
CPC ........ *G03F 7/0002* (2013.01); *B29C 35/0805* (2013.01); *B29C 59/02* (2013.01); *G03F 7/001* (2013.01); *G03F 7/70625* (2013.01); *G03F 9/7042* (2013.01); *G03F 9/7046* (2013.01); *H01L 21/0277* (2013.01); *B29C 2035/0827* (2013.01)

(58) Field of Classification Search
CPC ........ B29C 2035/0827; B29C 35/0805; B29C 59/02; G03F 7/0002; G03F 7/001; G03F 7/70625; G03F 9/7042; G03F 9/7046; H01L 21/0274; H01L 21/0277
See application file for complete search history.

(56) References Cited

U.S. PATENT DOCUMENTS

| | | | |
|---|---|---|---|
| 8,967,991 B2 | 3/2015 | Wuister et al. | |
| 2006/0266244 A1* | 11/2006 | Kruijt-Stegeman | ... B82Y 10/00 101/485 |
| 2010/0252188 A1* | 10/2010 | Inanami | ................. B82Y 10/00 118/504 |
| 2011/0192302 A1* | 8/2011 | Selinidis | ............... B82Y 10/00 101/463.1 |

(Continued)

FOREIGN PATENT DOCUMENTS

| | | |
|---|---|---|
| JP | 2013-168604 A | 8/2013 |
| JP | 6446943 B2 | 1/2019 |

*Primary Examiner* — Deoram Persaud
(74) *Attorney, Agent, or Firm* — Foley & Lardner LLP

(57) ABSTRACT

A template includes: a base material having a surface including a first pattern, a second pattern and a third pattern, the first pattern including a first recess, the second pattern including a second recess. The base material containing a first material having a first refractive index; a first layer disposed in the first recess and containing a second material, the second material having a second refractive index different from the first refractive index; and a second layer disposed in the second recess, containing the second material, and being thicker than the first layer.

20 Claims, 26 Drawing Sheets

(56) References Cited

U.S. PATENT DOCUMENTS

2012/0013042 A1\* 1/2012 Ota .................. B82Y 10/00
  264/293
2014/0061969 A1   3/2014 Okamoto et al.
2018/0264712 A1\* 9/2018 Asano ................ B29C 43/56

\* cited by examiner

TEMPLATE, TEMPLATE MANUFACTURING METHOD, AND SEMICONDUCTOR DEVICE MANUFACTURING METHOD

CROSS-REFERENCE TO RELATED APPLICATION(S)

This application is based upon and claims the benefit of priority from Japanese Patent Application No. 2020-048745, filed on Mar. 19, 2020, the entire contents of which are incorporated herein by reference.

FIELD

Embodiments described herein relate generally to a template, a template manufacturing method, and a semiconductor device manufacturing method.

BACKGROUND

In a method of manufacturing a semiconductor device, a technique of forming a fine pattern using a nanoimprint lithography (NIL) is known.

DETAILED DESCRIPTION

Figure 1:
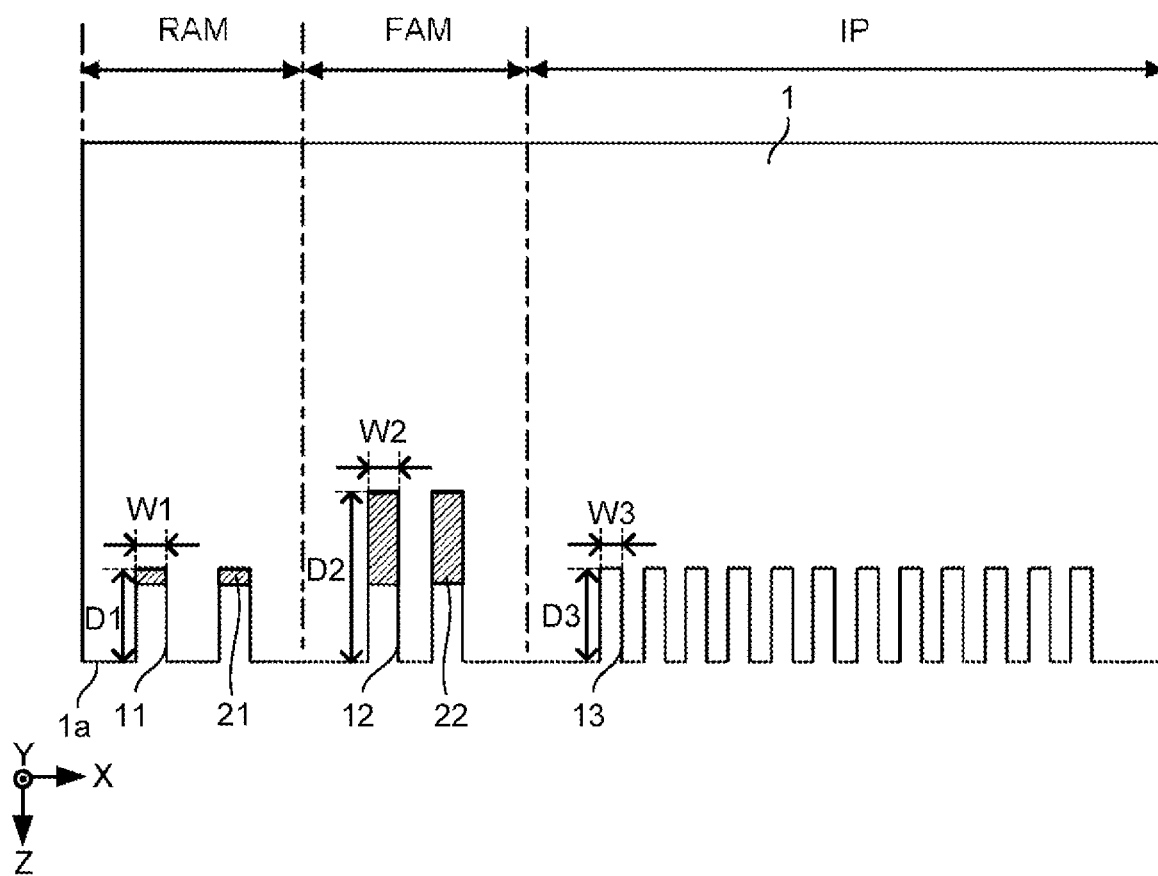
FIG. 1 is a schematic cross-sectional view illustrating an example of a template according to a first embodiment.

At least one embodiment provides improving the accuracy of alignment between a target and a template.

In general, according to at least one embodiment, the template includes: a base material having a surface including a first pattern, a second pattern and a third pattern, the first pattern including a first recess, the second pattern including a second recess, and the base material containing a first material having a first refractive index; a first layer disposed in the first recess and containing a second material, the second material having a second refractive index different from the first refractive index; and a second layer disposed in the second recess, containing the second material, and being thicker than the first layer.

Hereinafter, embodiments will be described with reference to the drawings. A relationship between the thickness of each element and the plane size, and the ratio of the thickness of each element illustrated in the drawings may be different from the actual product. In addition, in the embodiments, substantially the same components are designated by the same reference numerals, and the descriptions thereof will be appropriately omitted.

First Embodiment (Example of Template Structure)

FIG. 1 is a schematic cross-sectional view illustrating an example of a template according to a first embodiment, and illustrates a part of the X-Z cross-section including the Y axis of the template and the Z axis orthogonal to the Y axis. The example of the template of the first embodiment includes a base material 1, an optical layer 21, and an optical layer 22, as illustrated in FIG. 1.

A surface 1a of the base material 1 has a rough alignment mark RAM, a fine alignment mark FAM, and an imprint pattern IP. For convenience, FIG. 1 schematically illustrates the rough alignment mark RAM, the fine alignment mark FAM, and the imprint pattern IP that are adjacent to each other, but the actual template is not limited to the above structure.

In the pattern forming method using NIL, a mold (template) is pressed onto an imprint material layer such as an ultraviolet curable resin provided on a target, and light is irradiated to cure a layer containing the imprint material. Then, the imprint pattern IP is transferred to the imprint material layer. The pattern forming method includes an alignment of aligning the position of the template with the position of the target before pressing the template. By the alignment, the imprint pattern IP may be transferred to the imprint material layer with high positional accuracy.

The alignment between the template and the target includes a rough alignment and a fine alignment. In the rough alignment, before the imprint material layer is formed, the position of the rough alignment mark of the template and the position of the rough alignment mark of the target are detected with low accuracy by an optical detector such as an image sensor, and the position of the template and the position of the target are adjusted to minimize a misalignment between the template and the target. In the fine alignment, after the imprint material layer is formed, the position of the fine alignment mark of the template and the position of the fine alignment mark of the target are detected with high accuracy by an optical detector to adjust the position of the template and the position of the target. By combining the rough alignment and the fine alignment, the position of the template and the position of the target may be efficiently aligned.

The rough alignment mark RAM has a first pattern including at least one recess 11. FIG. 1 illustrates the rough alignment mark RAM including a plurality of recesses 11 as an example. The recess 11 has a width W1 and a depth D1 from the surface 1a.

The fine alignment mark FAM has a second pattern including at least one recess 12. FIG. 1 illustrates the fine alignment mark FAM including a plurality of recesses 12 as an example. The recess 12 has a width W2 and a depth D2 from the surface 1a.

The imprint pattern IP constitutes a pattern such as a wiring pattern for transferring to a target. The imprint pattern IP includes at least one recess 13. FIG. 1 illustrates a plurality of recesses 13 as an example. The recess 13 has a width W3 and a depth D3 from the surface 1a.

The width W1 of the recess 11, the width W2 of the recess 12, and the width W3 of the recess 13 may be the same as, or different from, each other. The width W3 of the recess 13 may be smaller than, for example, the width W1 of the recess 11 and the width W2 of the recess 12.

The depth D1 of the recess 11 may be greater than the width W1. The depth D2 of the recess 12 may be greater than the width W2. The depth D3 of the recess 13 may be greater than the width W3.

The depth D2 of the recess 12 may be greater than the depth D1 of the recess 11 and the depth D3 of the recess 13. The depth D3 of the recess 13 may be the same as, or different from, the depth D1 of the recess 11.

The base material 1 contains a first material having a first refractive index with respect to light from the optical detector. The first material includes, for example, quartz. The base material 1 preferably transmits the light from the optical detector.

The optical layer 21 is provided in the recess 11. The optical layer 21 contacts, for example, an inner bottom surface and an inner wall surface of the recess 11. The thickness of the optical layer 21 may be smaller than the depth D1 of the recess 11.

The optical layer 22 is provided in the recess 12. The optical layer 22 contacts, for example, an inner bottom surface and an inner wall surface of the recess 12. The thickness of the optical layer 22 may be smaller than the depth D2 of the recess 12. The exposed surface of the optical layer 22 may be flush with the exposed surface of the optical layer 21.

Each of the optical layer 21 and the optical layer 22 contains a second material having a second refractive index different from the first refractive index with respect to the light from the optical detector. The second material may be, for example, chromium. Without being limited thereto, the second material includes at least one material selected from, for example, a group consisting of titanium, tantalum, tungsten, chromium, copper, silicon carbide, and silicon fluoride. Each of the optical layer 21 and the optical layer 22 preferably forms, for example, a light-shielding layer that reflects light from the optical detector. The second material included in the optical layer 21 and the second material contained in the optical layer 22 may be the same material or different material. If the optical layer 21 and the optical layer 22 include different materials, each refractive index may be different.

Figure 2:
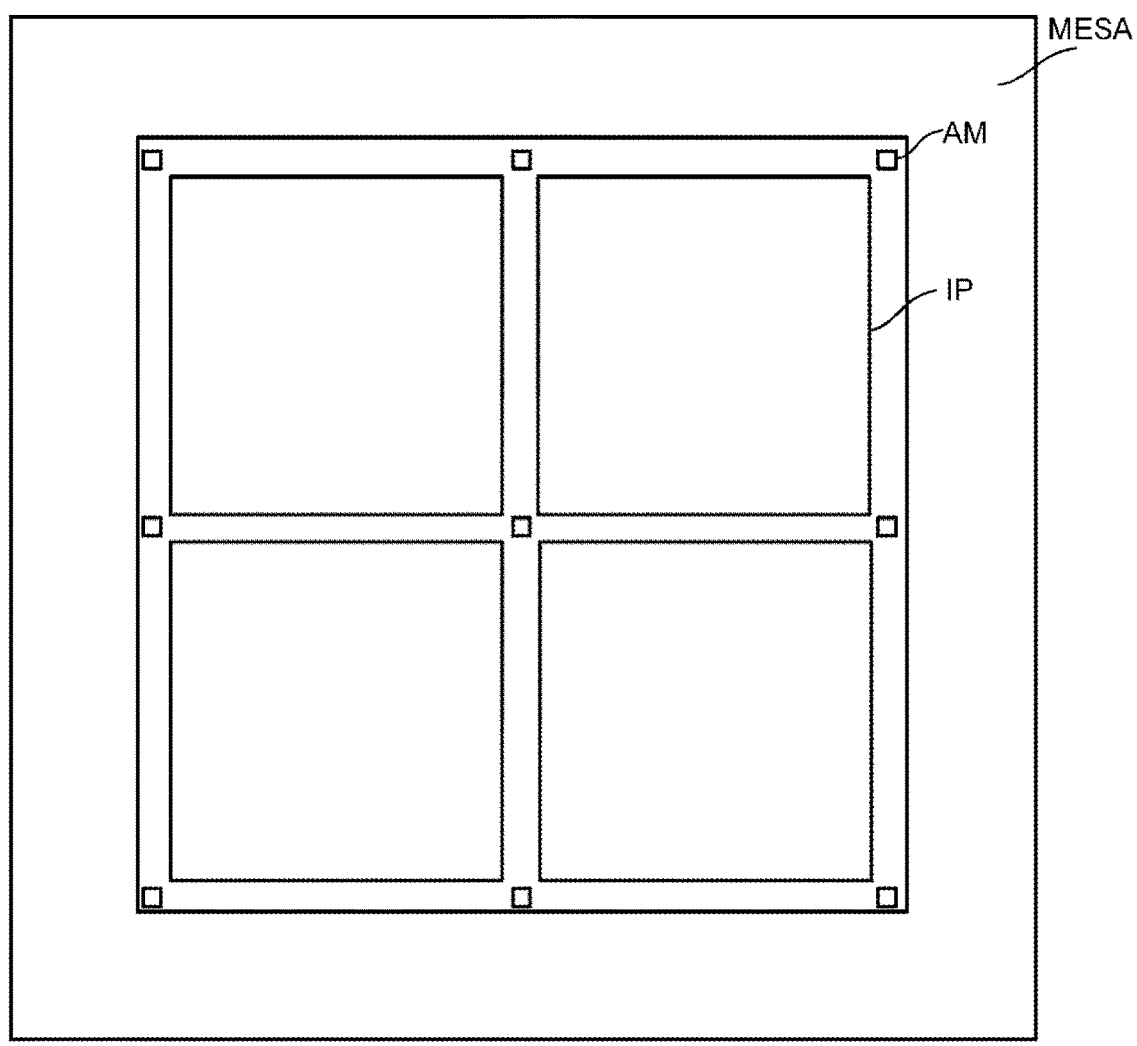
FIG. 2 is a schematic top view illustrating a layout example of the template according to at least one embodiment.

FIG. 2 is a schematic top view illustrating a layout example of the template and illustrates a part of an X-Y plane including the X axis and the Y axis orthogonal to the Y axis of the template. As illustrated in FIG. 2, the layout example of the template has a plurality of imprint patterns IP and a plurality of alignment marks AM which are provided on a plane MESA called a mesa. The plurality of alignment marks AM may be arranged, for example, at a plurality of corners of a plurality of imprint patterns. The shape of the imprint pattern IP is not particularly limited.

Figure 3:
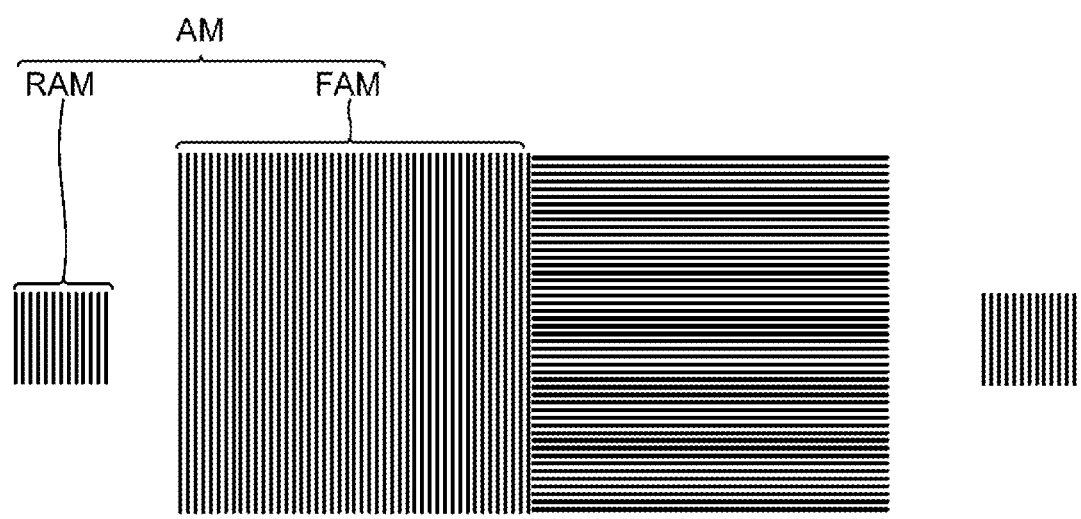
FIG. 3 is a schematic top view illustrating a layout example of an alignment mark AM according to at least one embodiment.

FIG. 3 is a schematic top view illustrating a layout example of the alignment mark AM. The alignment mark AM has two rough alignment marks RAM and two fine alignment marks FAM, which are arranged between the two rough alignment marks RAM.

Each of the rough alignment mark RAM and the fine alignment mark FAM includes a line and space pattern as illustrated in, for example, FIG. 3. The recesses 11 and 12 correspond to the lines of the line and space pattern. The length of the line is not particularly limited. The two fine alignment marks FAM may have shapes extending in directions different from each other by 90 degrees. The patterns of the rough alignment mark RAM and the fine alignment mark FAM are not limited to the patterns illustrated in FIG. 3.

(Example of Template Manufacturing Method)

Figure 4:
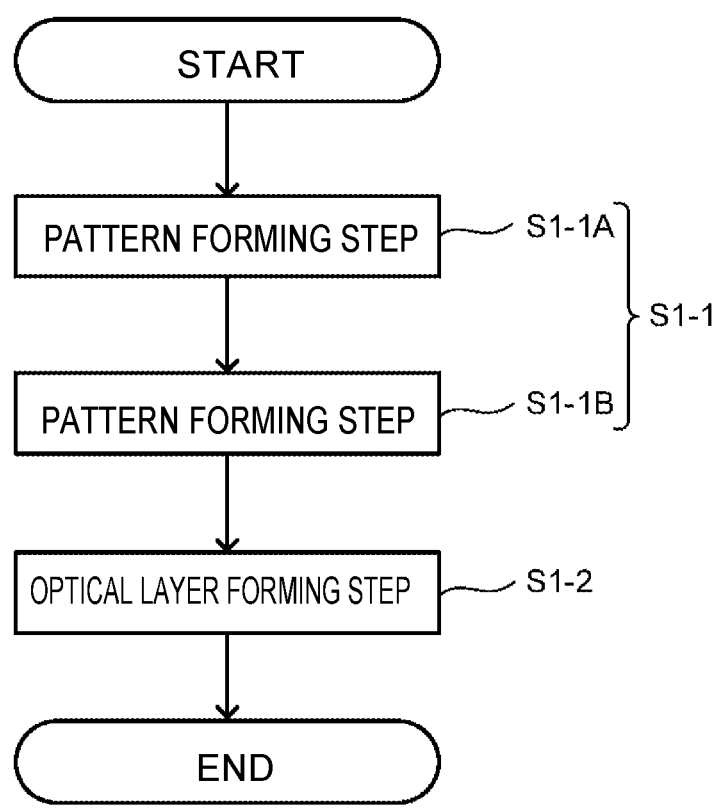
FIG. 4 is a flowchart of an example of a template manufacturing method according to the first embodiment.

FIG. 4 is a flowchart of an example of a template manufacturing method of the first embodiment. As illustrated in FIG. 4, the example of the template manufacturing method of the first embodiment includes a pattern forming step S1-1 and an optical layer forming step S1-2.

[Pattern Forming Step S1-2]

As illustrated in FIG. 4, the example of the pattern forming step S1-1 includes a pattern forming step S1-1A and a pattern forming step S1-1B.

Figure 5:
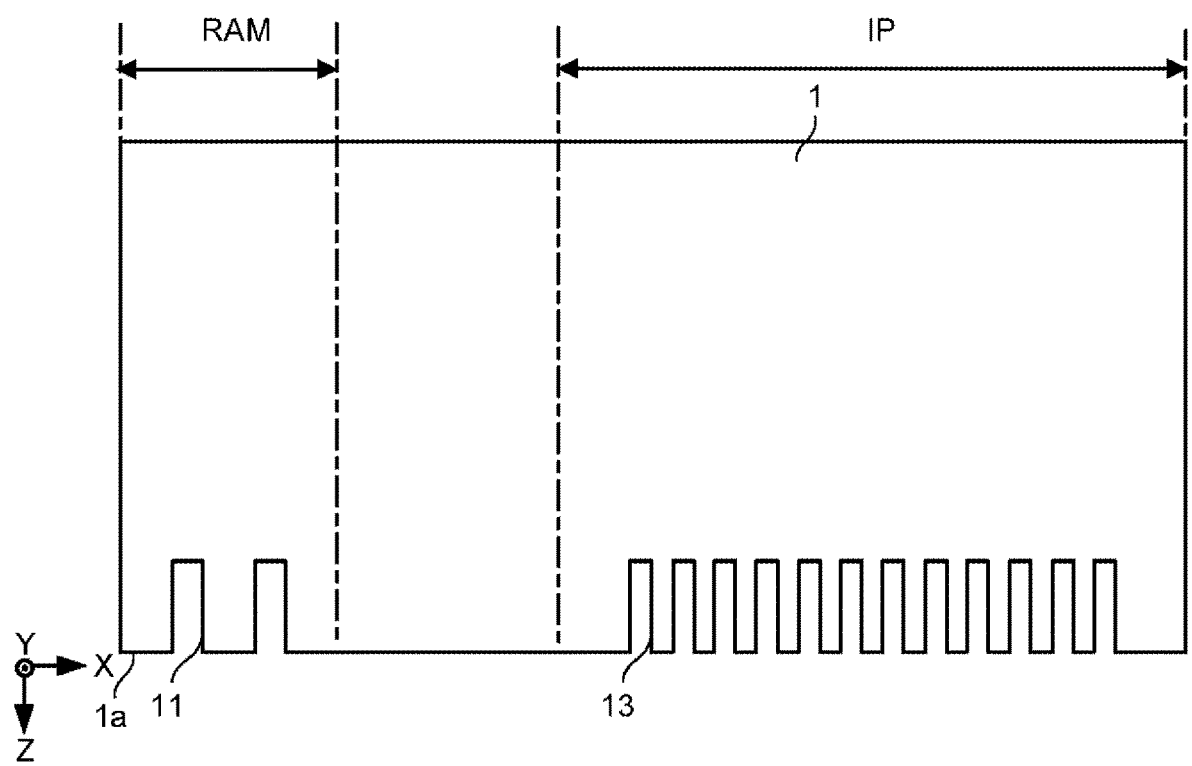
FIG. 5 is a schematic cross-sectional view illustrating an example of a pattern forming step S1-1A according to at least one embodiment.

FIG. 5 is a schematic cross-sectional view illustrating an example of the pattern forming step S1-1A, and illustrates a part of the X-Z cross-section of the base material 1. In addition, for convenience, each schematic cross-sectional view illustrates the surface 1a downward, but each processing step may be performed on the base material 1 with the surface 1a facing upward. By the pattern forming step S1-1A, as illustrated in FIG. 5, the rough alignment mark RAM, including the recess 11, and the imprint pattern IP, including the recess 13 are formed on the surface 1a. The recess 11 and the recess 13 are formed by forming a mask layer using, for example, photolithography, and processing the base material 1 using the mask layer.

Figure 6:
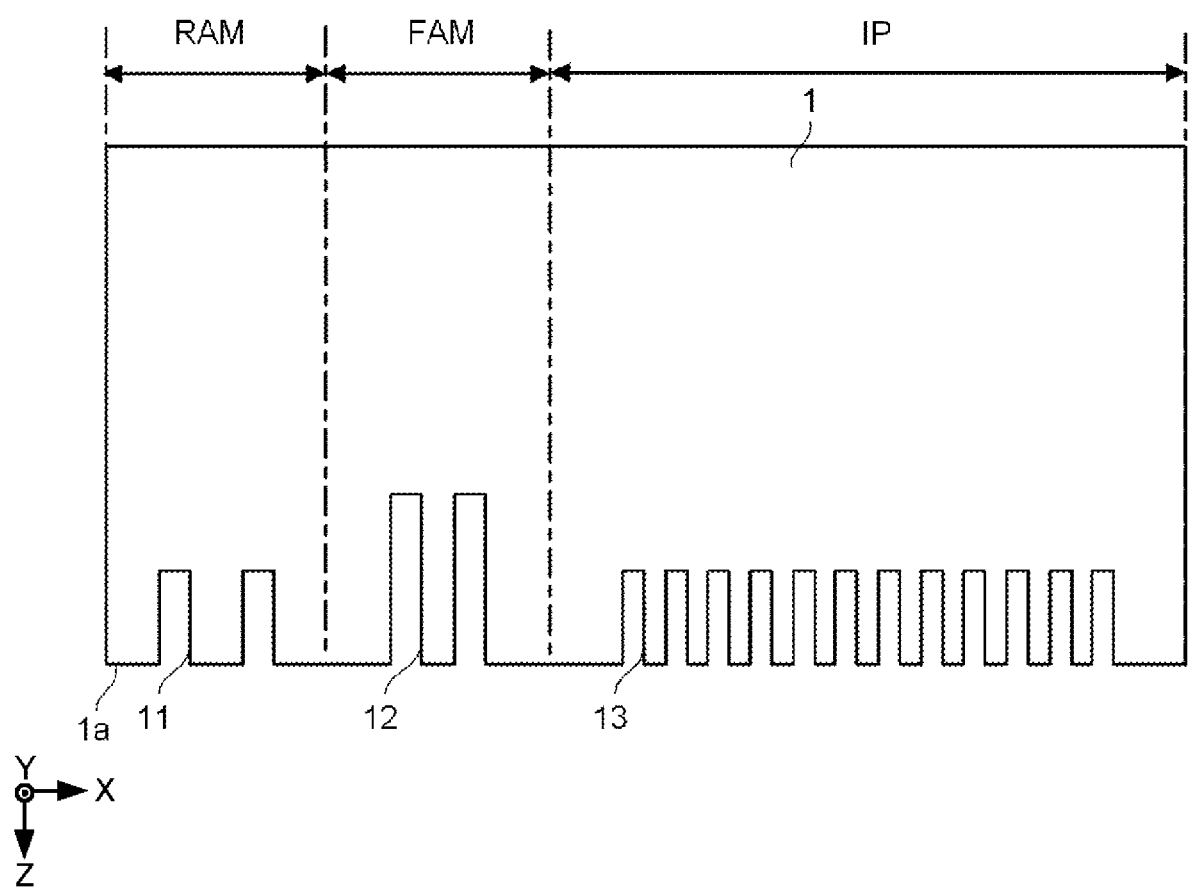
FIG. 6 is a schematic cross-sectional view illustrating an example of a pattern forming step S1-1B according to at least one embodiment.

FIG. 6 is a schematic cross-sectional view illustrating an example of the pattern forming step S1-1B, and illustrates a part of the X-Z cross-section of the base material 1. By the pattern forming step S1-1B, as illustrated in FIG. 6, the fine alignment mark FAM including the recess 12 is formed on the surface 1a. The recess 12 is formed, for example, by forming a mask layer using photolithography, and processing the base material 1 using the mask layer.

The pattern forming step S1-1B may be provided before the pattern forming step S1-1A. That is, the fine alignment mark FAM is formed before or after the rough alignment mark RAM and the imprint pattern IP are formed.

[Optical Layer Forming Step S1-2]

Figure 7:
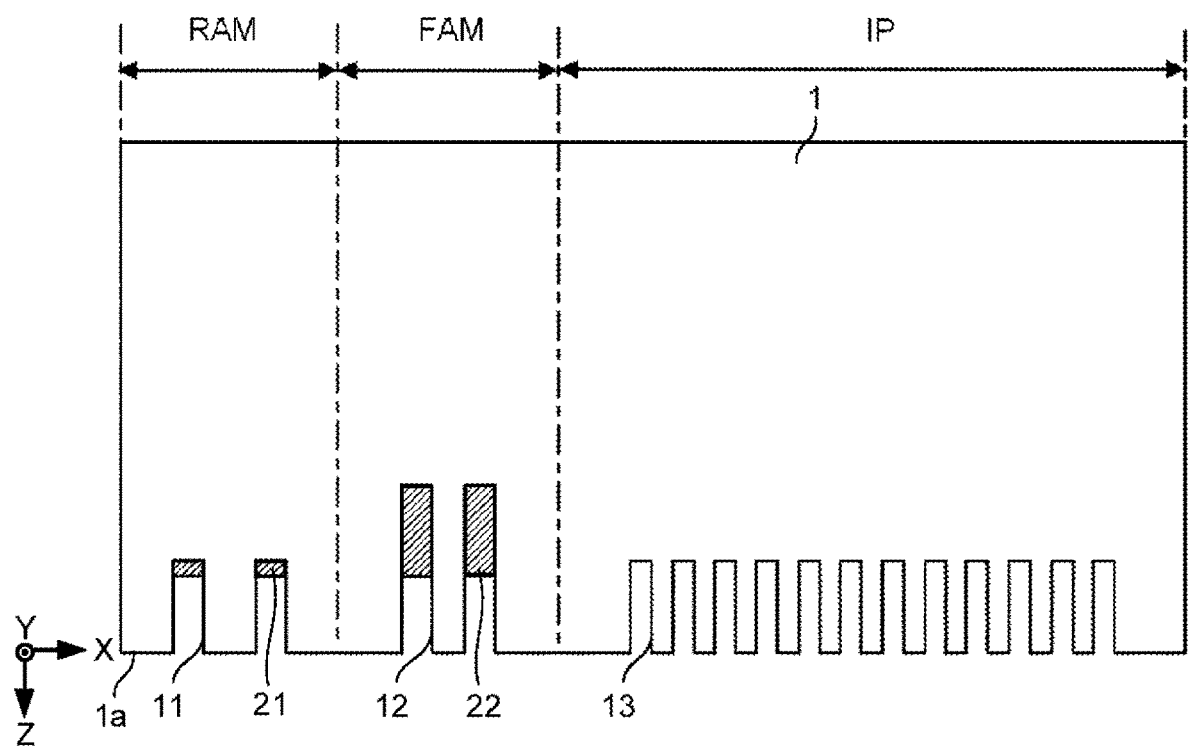
FIG. 7 is a schematic cross-sectional view illustrating an example of an optical layer forming step S1-2 according to at least one embodiment.

FIG. 7 is a schematic cross-sectional view illustrating an example of the optical layer forming step S1-2, and illustrates a part of the X-Z cross-section of the base material 1. In the optical layer forming step S1-2, the optical layer 21 is formed in the recess 11 and the optical layer 22 is formed in the recess 12, as illustrated in FIG. 7. The optical layers 21 and 22 are formed by forming a mask layer that covers the imprint pattern IP using, for example, photolithography, and depositing the second material in the recesses 11 and 12 by sputtering. The smaller a surface area of the deposition surface, the more difficult it is for the second material to be deposited, and the second material is deposited more in the recess 12 than in the recess 11. Thus, the optical layer 21 and the optical layer 22 thicker than the optical layer 21 may be formed. The optical layer 21 and the optical layer 22 may be formed in the same step or the different step.

As described above, the template of the first embodiment includes the base material 1 having the rough alignment mark RAM including the first pattern and the fine alignment mark FAM including the second pattern, the optical layer 21 provided in the recess 11 of the first pattern, and the optical layer 22 provided in the recess 12 of the second pattern and thicker than the optical layer 21.

As the imprint pattern IP is miniaturized, the patterns of the rough alignment mark RAM and the fine alignment mark FAM are also miniaturized. Due to the above miniaturization, the optical layer having a thickness of 2 nm to 3 nm in the related art may cause a decrease in the intensity of the detection signal by the optical detector. In particular, when the intensity of the detection signal of the fine alignment mark FAM is reduced, the precision of fine alignment between the template and the target is significantly reduced.

In contrast, by making the optical layer 22 thicker than the thickness of the related art, it is possible to prevent a decrease in the intensity of the detection signal of the fine alignment mark FAM, and thus it is possible to improve the alignment accuracy between the target and the template.

Second Embodiment (Example of Template Structure)

Figure 8:
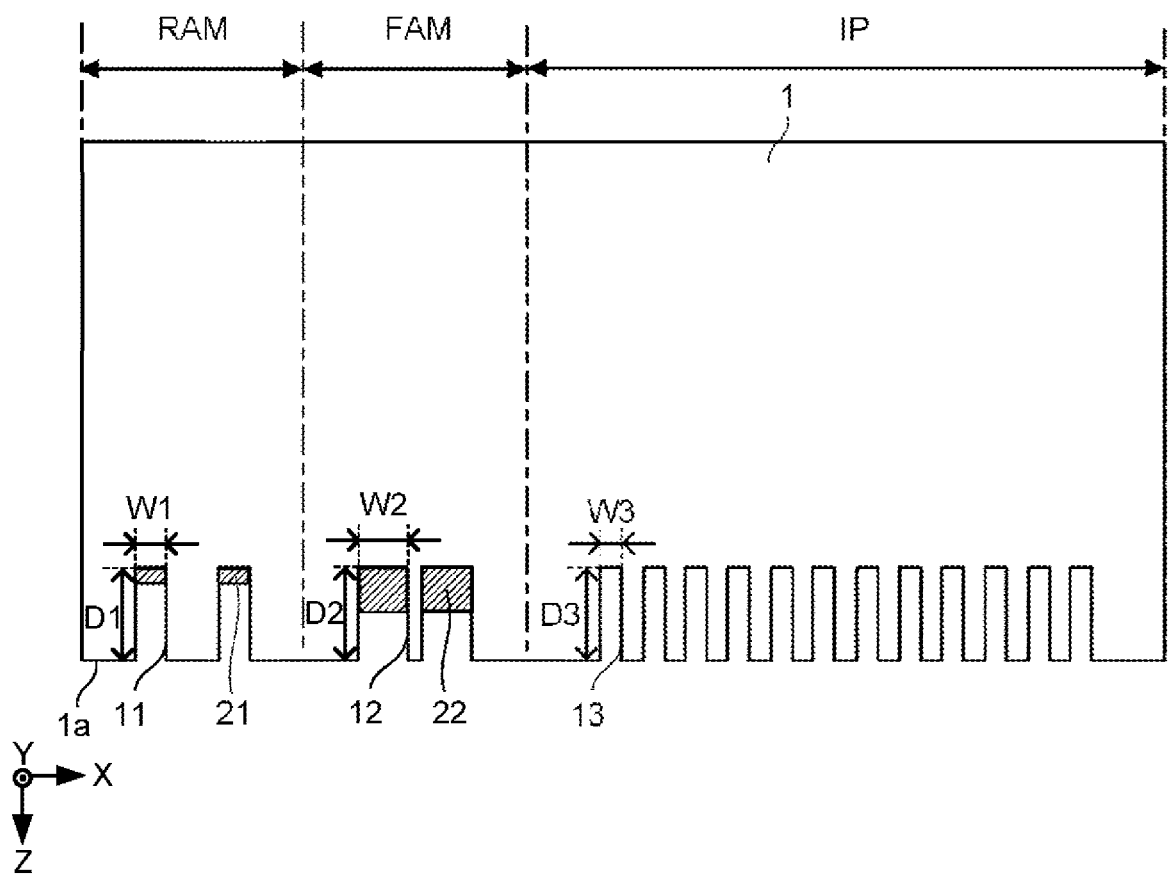
FIG. 8 is a schematic cross-sectional view illustrating an example of a template of a second embodiment.

FIG. 8 is a schematic cross-sectional view illustrating an example of the template of the second embodiment and illustrates a part of the X-Z cross-section of the template. The example of the template of the second embodiment includes a base material 2, an optical layer 21, and an optical layer 22, as illustrated in FIG. 8.

The base material 1 illustrated in FIG. 8 is different from the base material 1 illustrated in FIG. 1 in the width W2 and the depth D2 of the recess 12. The width W2 of the recess 12 is greater than the width W1 of the recess 11. The depth D2 of the recess 12 is the same as the depth D1 of the recess 11 and the depth D3 of the recess 13. For further description of the base material 1, the description of the base material 1 of the first embodiment may be appropriately incorporated.

The optical layer 21 illustrated in FIG. 8 is the same as the optical layer 21 illustrated in FIG. 1. The width of the optical layer 22 illustrated in FIG. 8 is greater than the width of the optical layer 21. For further description of the optical layers 21 and 22, the description of the optical layers 21 and 22 of the first embodiment may be appropriately incorporated.

(Example of Template Manufacturing Method)

Figure 9:
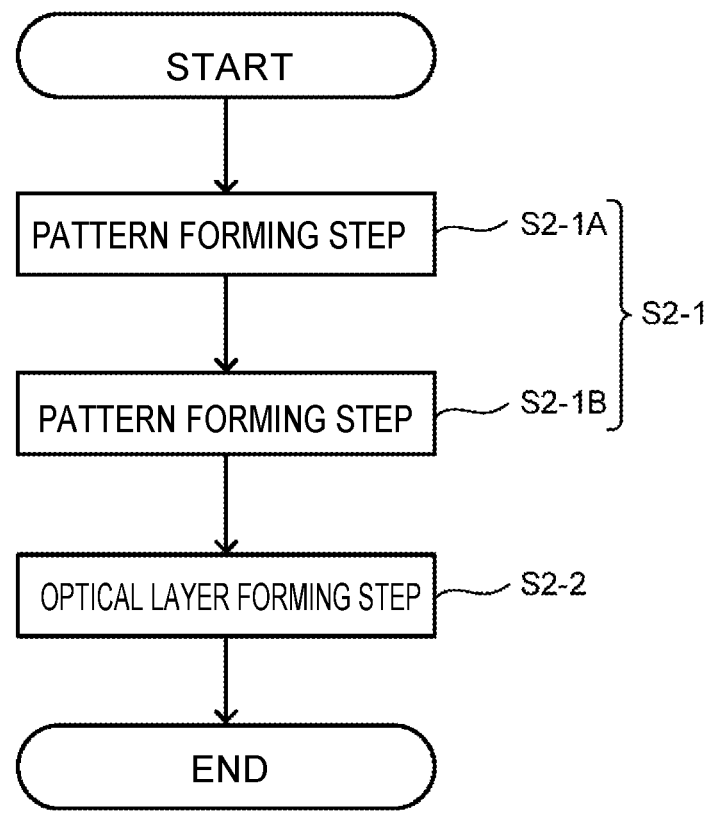
FIG. 9 is a flowchart of an example of a template manufacturing method according to the second embodiment.

FIG. 9 is a flowchart of an example of a template manufacturing method of the second embodiment. As illustrated in FIG. 9, the template manufacturing method according to the second embodiment includes a pattern forming step S2-1 and an optical layer forming step S2-2.

[Pattern Forming Step S2-1]

An example of the pattern forming step S2-1 includes a pattern forming step S2-1A and a pattern forming step S2-1B, as illustrated in FIG. 9.

Figure 10:
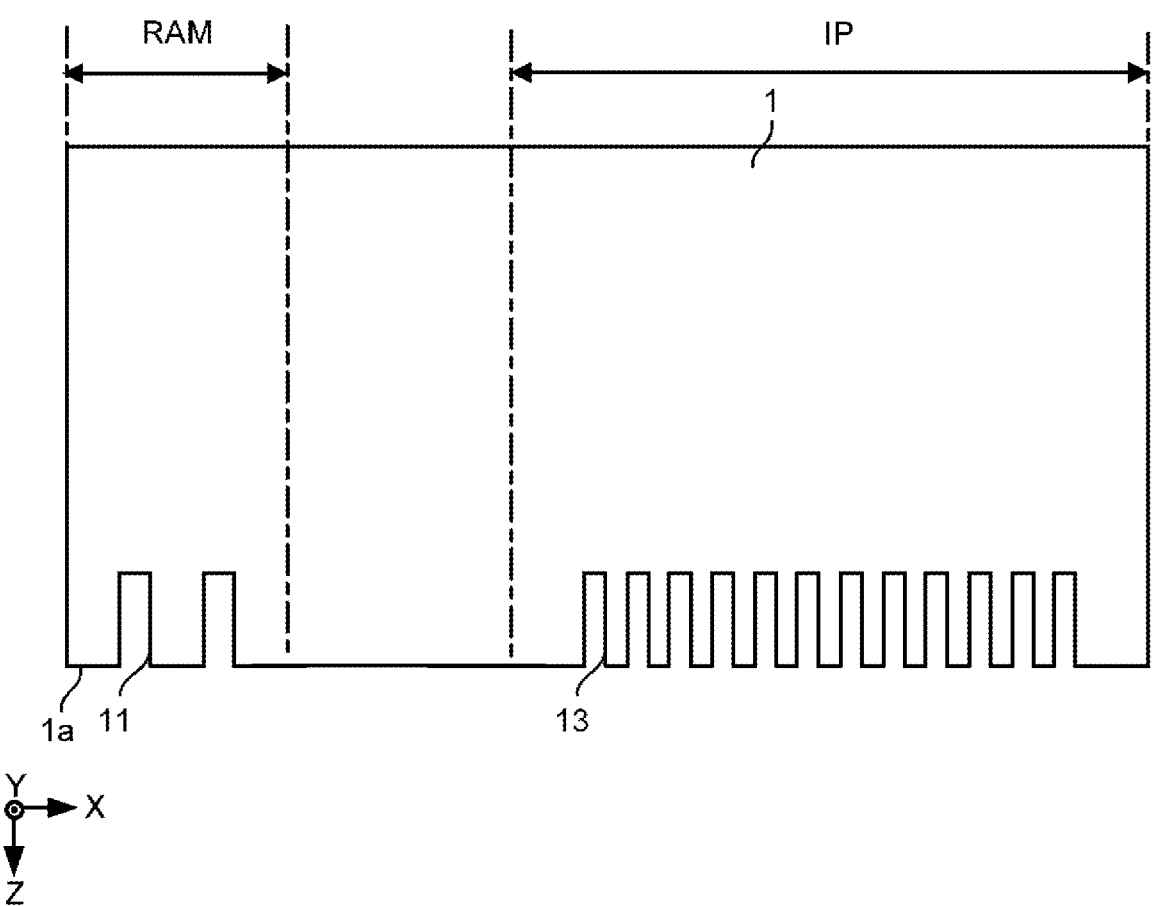
FIG. 10 is a schematic cross-sectional view illustrating an example of a pattern forming step S2-1A according to at least one embodiment.

FIG. 10 is a schematic cross-sectional view illustrating an example of the pattern forming step S2-1A, and illustrates a part of the X-Z cross-section of the base material 1. In the pattern forming step S2-1A, as illustrated in FIG. 10, the rough alignment mark RAM including the recess 11 and the imprint pattern IP including the recess 13 are formed on the surface 1a. The recess 11 and the recess 13 are formed by forming a mask layer using, for example, photolithography and processing the base material 1 using the mask layer.

Figure 11:
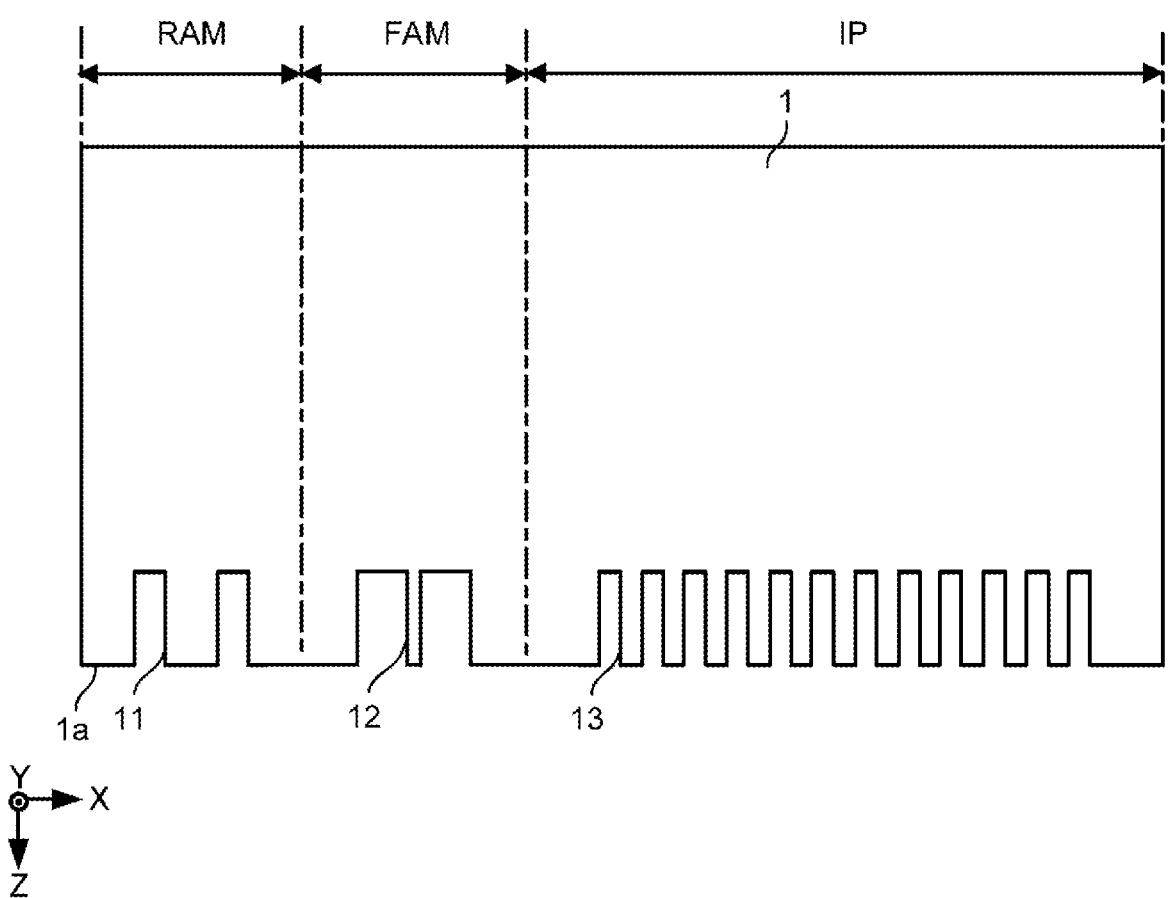
FIG. 11 is a schematic cross-sectional view illustrating an example of a pattern forming step S2-1B according to at least one embodiment.

FIG. 11 is a schematic cross-sectional view illustrating an example of the pattern forming step S2-1B, and illustrates a part of the X-Z cross-section of the base material 1. In the pattern forming step S2-1B, as illustrated in FIG. 11, the fine alignment mark FAM including the recess 12 is formed on the surface 1a. The recess 12 is formed by forming a mask layer using, for example, photolithography and processing the base material 1 using the mask layer.

The pattern forming step S2-1B may be provided before the pattern forming step S2-1A. That is, the fine alignment mark FAM is formed before or after the rough alignment mark RAM and the imprint pattern IP are formed.

[Optical Layer Forming Step S2-2]

Figure 12:
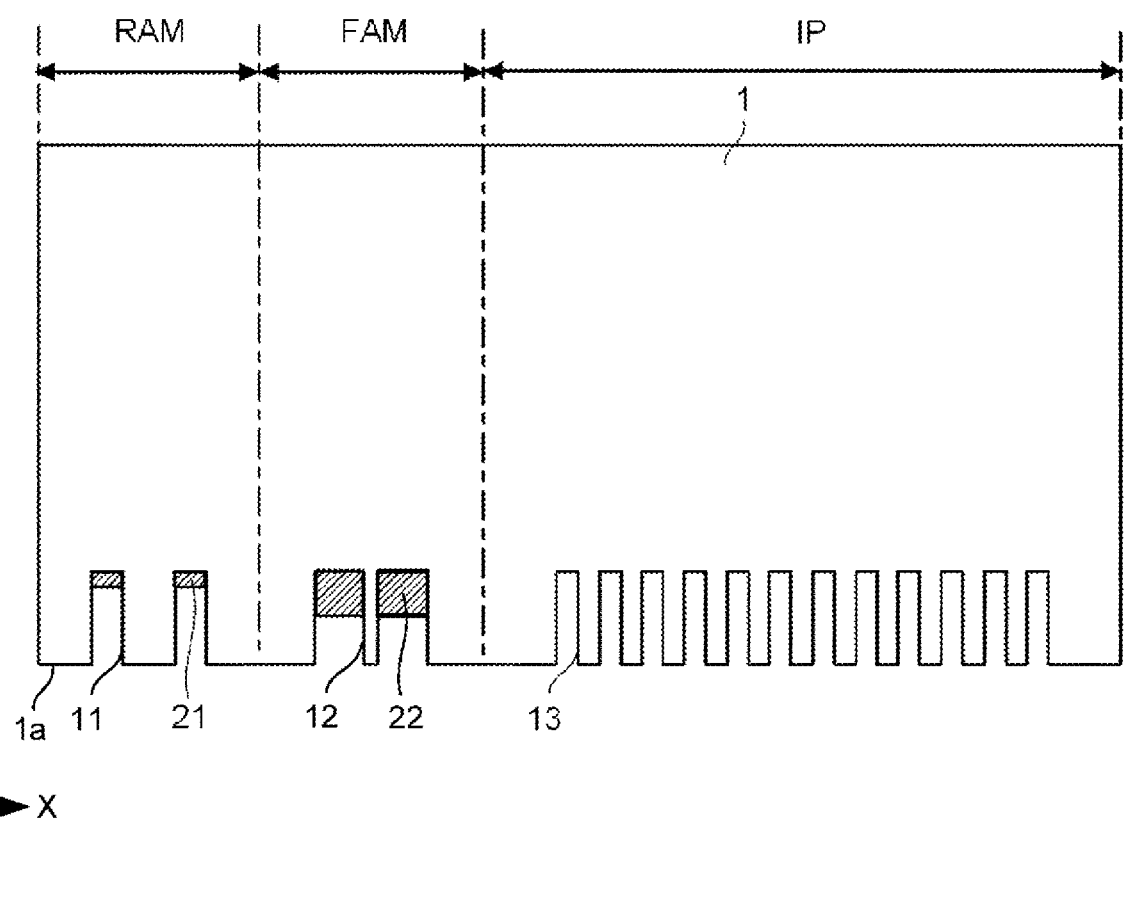
FIG. 12 is a schematic cross-sectional view illustrating an example of an optical layer forming step S2-2 according to at least one embodiment.

FIG. 12 is a schematic cross-sectional view illustrating an example of the optical layer forming step S2-2, and illustrates a part of the X-Z cross-section of the base material 1. In the optical layer forming step S2-2, the optical layer 21 is formed in the recess 11 and the optical layer 22 is formed in the recess 12, as illustrated in FIG. 12. The optical layers 21 and 22 are formed by forming a mask layer that covers the imprint pattern IP using, for example, photolithography, and depositing the second material in the recesses 11 and 12 by sputtering. The smaller a surface area of the deposition surface, the more difficult it is for the second material to be deposited, and the second material is deposited more in the recess 12 than in the recess 11. Thus, the optical layer 21 and the optical layer 22 thicker than the optical layer 21 may be formed in the same step.

As described above, the template of the second embodiment includes the base material 1 having the rough alignment mark RAM including the first pattern and the fine alignment mark FAM including the second pattern, the optical layer 21 provided in the recess 11 of the first pattern, and the optical layer 22 provided in the recess 12 of the second pattern and thicker than the optical layer 21.

As the imprint pattern IP is miniaturized, the patterns of the rough alignment mark RAM and the fine alignment mark FAM are also miniaturized. Due to the above miniaturization, the optical layer having a thickness of 2 nm to 3 nm in the related art may cause a decrease in the intensity of the detection signal by the optical detector. In particular, when the intensity of the detection signal of the fine alignment mark FAM is reduced, the precision of fine alignment between the template and the target is significantly reduced.

In contrast, by making the optical layer 22 thicker than the thickness of that in the related art, it is possible to prevent a decrease in the intensity of the detection signal of the fine alignment mark FAM. Further, by setting the depth D2 of the recess 12 to be the same as the depth D1 of the recess 11, it is possible to prevent an erroneous detection of the position of the fine alignment mark FAM. In addition, by widening the width of the recess 12 and the optical layer 22, a high contrast may be formed between the recess 12 and the surface 1a when the position of the fine alignment mark FAM is detected by irradiating light from the optical detector. Therefore, the accuracy of alignment between the target and the template may be improved.

The present embodiment may be combined with any of the other embodiments as appropriate.

Third Embodiment (Example of Template Structure)

Figure 13:
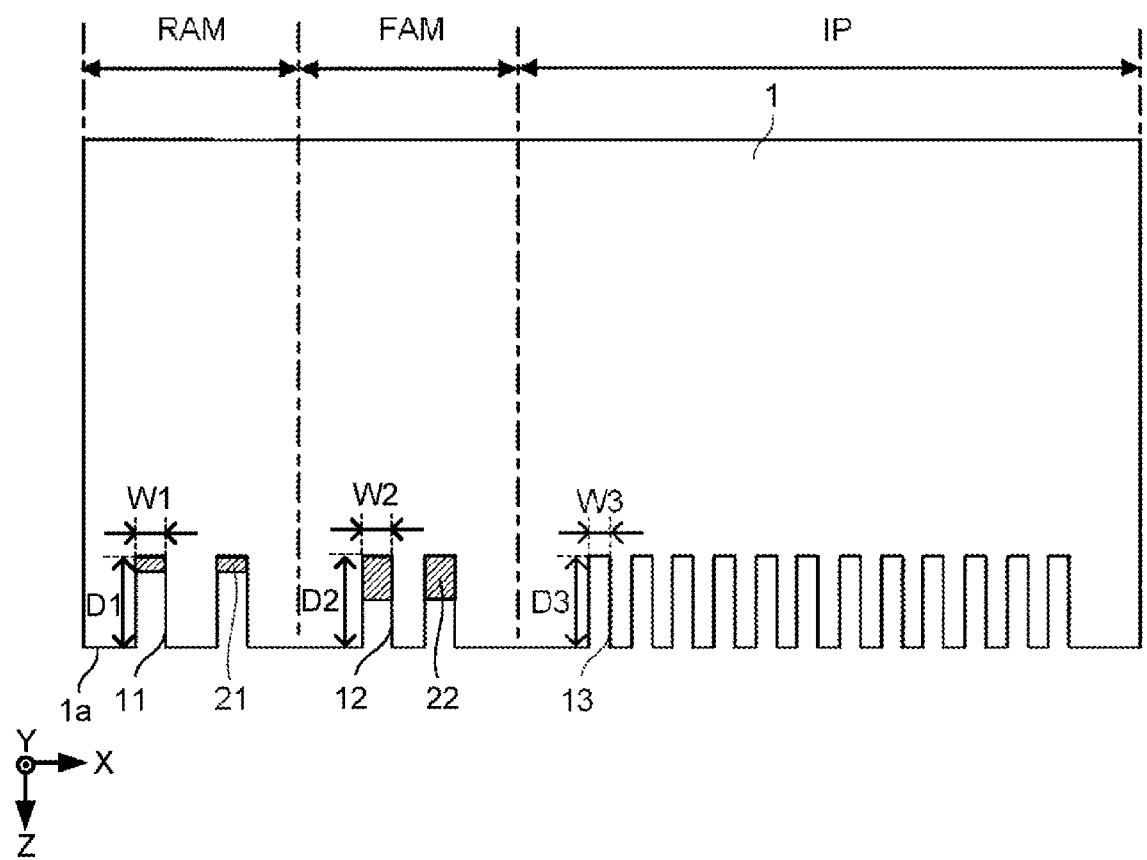
FIG. 13 is a schematic cross-sectional view illustrating an example of a template according to a third embodiment.

FIG. 13 is a schematic cross-sectional view illustrating an example of the template of the third embodiment, and illustrates a part of the X-Z cross-section of the template. The example of the template of the third embodiment includes a base material 2, an optical layer 21, and an optical layer 22, as illustrated in FIG. 13.

The base material 1 illustrated in FIG. 13 is different from the base material 1 illustrated in FIG. 1 in the depth D2 of the recess 12. The depth D2 of the recess 12 is the same as the depth D1 of the recess 11 and the depth D3 of the recess 13. For further description of the base material 1, the description of the base material 1 of the first embodiment may be appropriately incorporated.

The optical layer 21 illustrated in FIG. 13 is the same as the optical layer 21 illustrated in FIG. 1. The exposed surface of the optical layer 22 illustrated in FIG. 13 is not flush with the exposed surface of the optical layer 21. For further description of the optical layers 21 and 22, the description of the optical layers 21 and 22 of the first embodiment may be appropriately incorporated.

(Example of Template Manufacturing Method)

Figure 14:
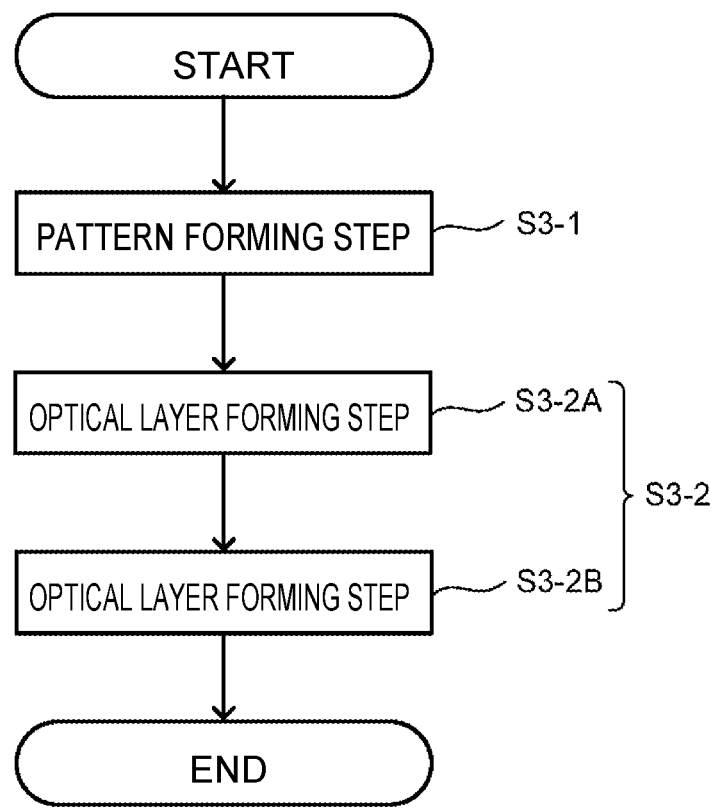
FIG. 14 is a flowchart of an example of a template manufacturing method according to the third embodiment.

FIG. 14 is a flowchart of an example of the template manufacturing method according to the third embodiment. As illustrated in FIG. 14, the example of the template manufacturing method of the third embodiment includes a pattern forming step S3-1 and an optical layer forming step S3-2.

[Pattern Forming Step S3-1]

Figure 15:
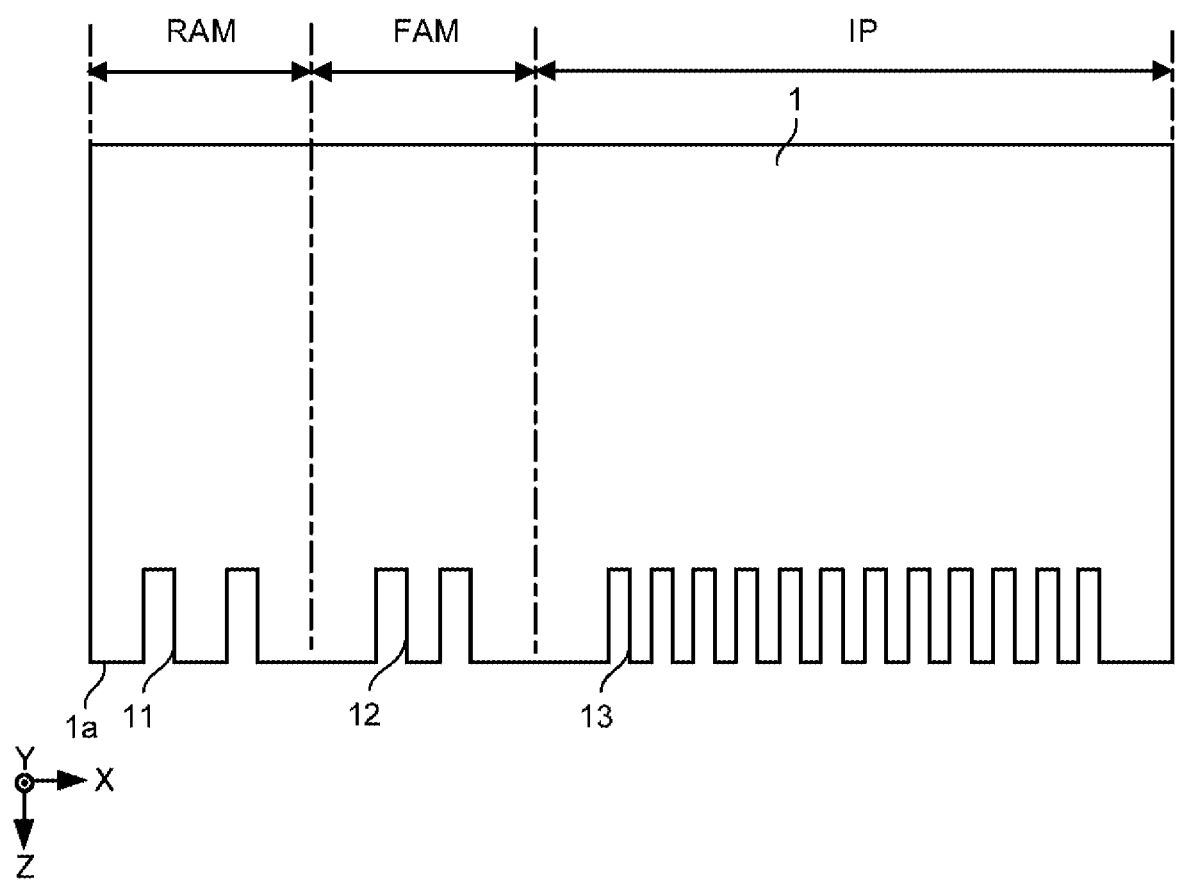
FIG. 15 is a schematic cross-sectional view illustrating an example of a pattern forming step S3-1 according to at least one embodiment.

FIG. 15 is a schematic cross-sectional view illustrating the example of the pattern forming step S3-1 and illustrates a part of the X-Z cross-section of the base material 1. In the pattern forming step S3-1, as illustrated in FIG. 15, a rough alignment mark RAM including the recess 11, a fine alignment mark FAM including the recess 12, and an imprint pattern IP including the recess 13 are formed on the surface 1a. The recess 11, the recess 12, and the recess 13 are formed by forming a mask layer using, for example, photolithography and processing the base material 1 using the mask layer.

[Optical Layer Forming Step S3-2]

The example of the optical layer forming step S3-2 includes an optical layer forming step S3-2A and an optical layer forming step S3-2B, as illustrated in FIG. 14.

Figure 16:
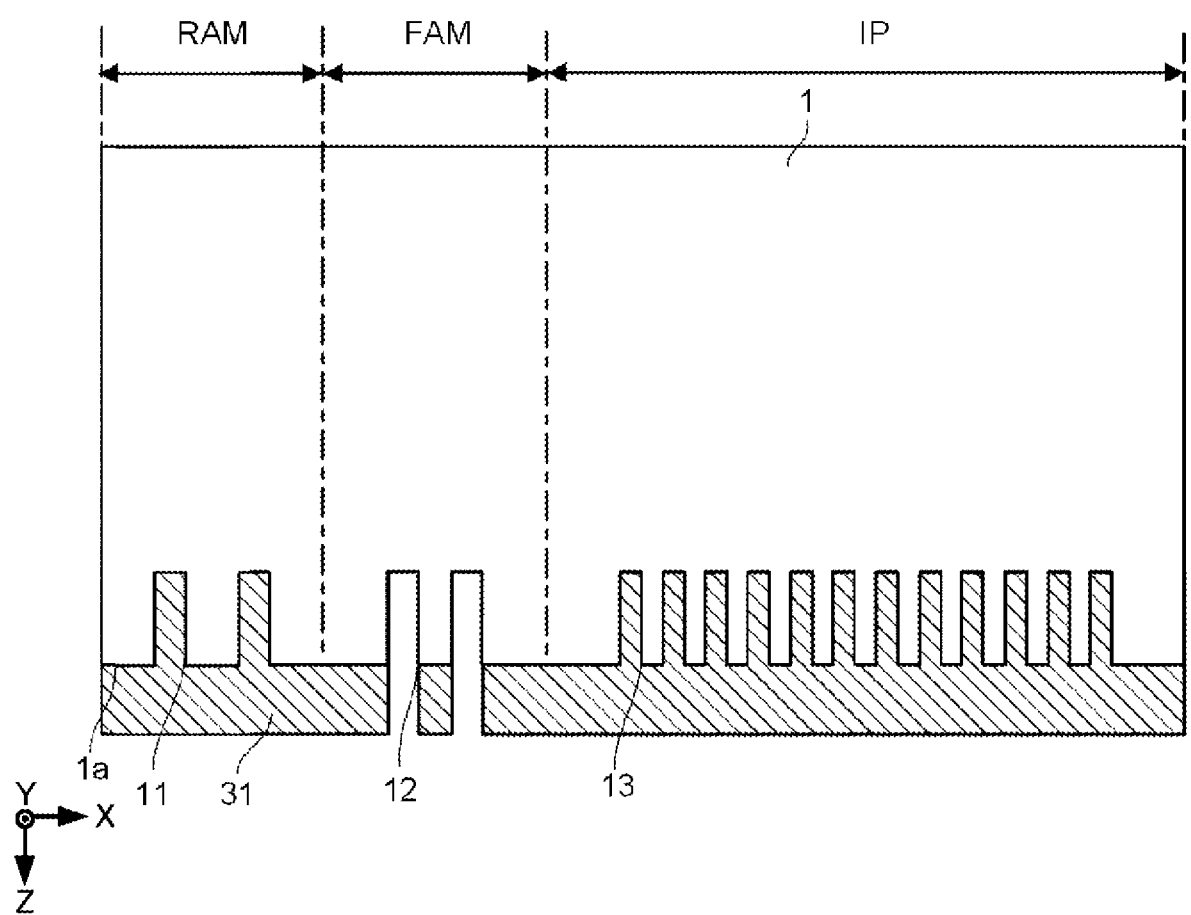
FIG. 16 is a schematic cross-sectional view illustrating an optical layer forming step S3-2A according to at least one embodiment.
Figure 17:
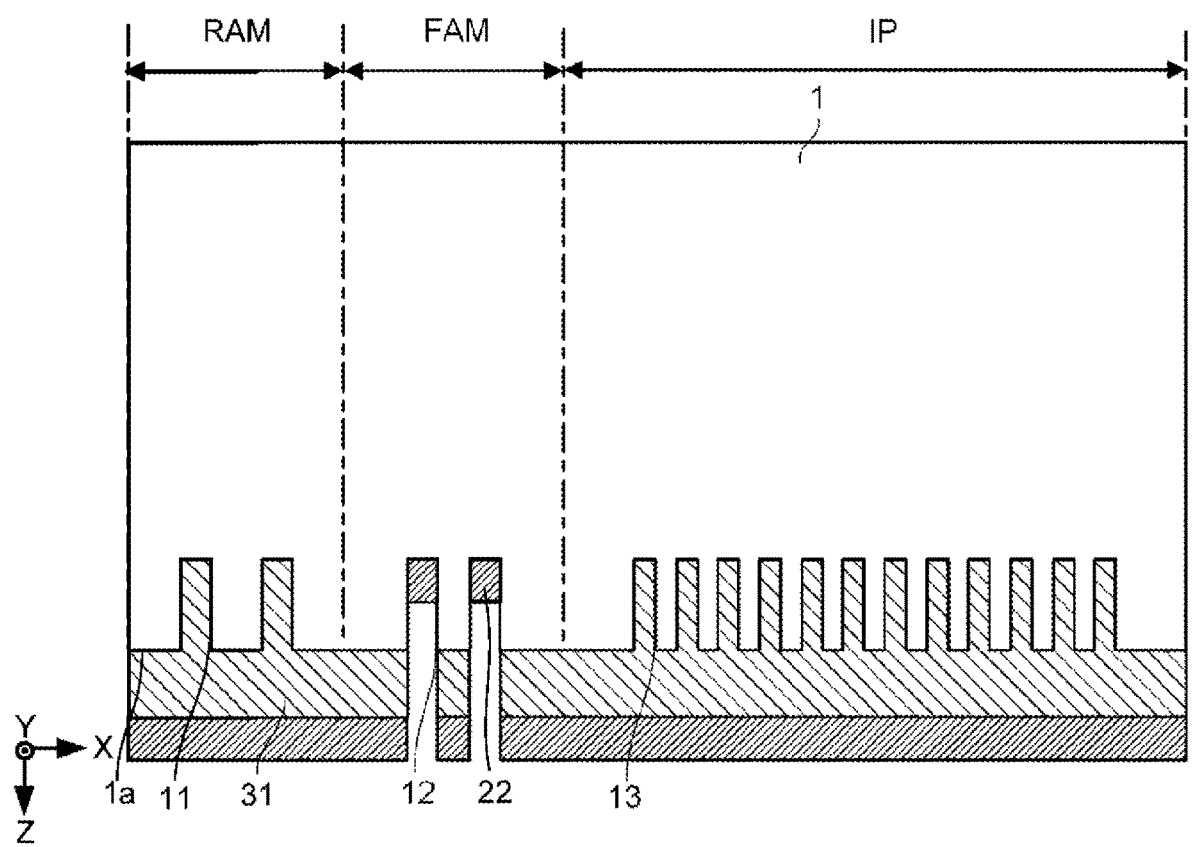
FIG. 17 is a schematic cross-sectional view illustrating the optical layer forming step S3-2A according to at least one embodiment.

FIGS. 16 and 17 are schematic cross-sectional views illustrating the optical layer forming step S3-2A, and illustrate a part of the X-Z cross-section of the base material 1. In the optical layer forming step S3-2A, as illustrated in FIG. 16, a mask layer 31 such as a photoresist is formed on the surface 1a of the base material 1 by photolithography to cover the rough alignment mark RAM and the imprint pattern IP. Then, as illustrated in FIG. 17, the second material is deposited in the recess 12 by, for example, sputtering to form the optical layer 22. The mask layer 31 is removed after the optical layer 22 is formed.

Figure 18:
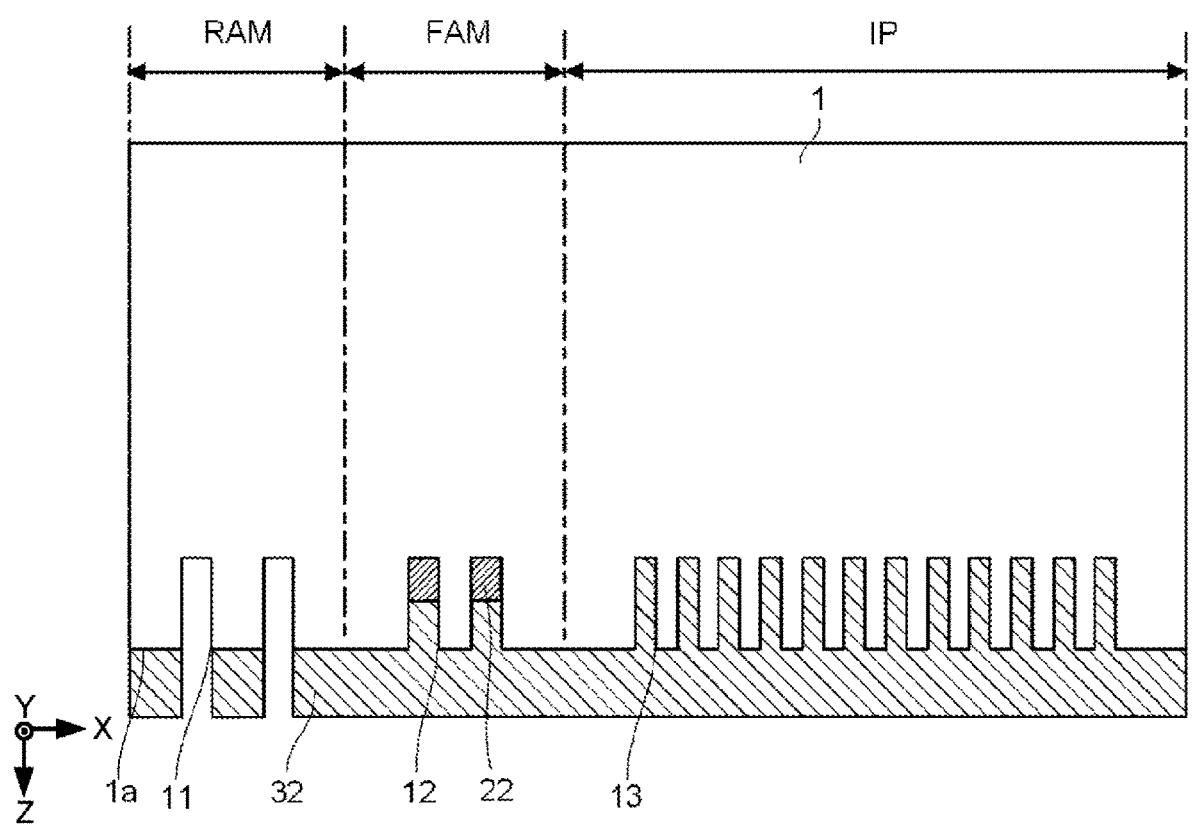
FIG. 18 is a schematic cross-sectional view illustrating an optical layer forming step S3-2B according to at least one embodiment.
Figure 19:
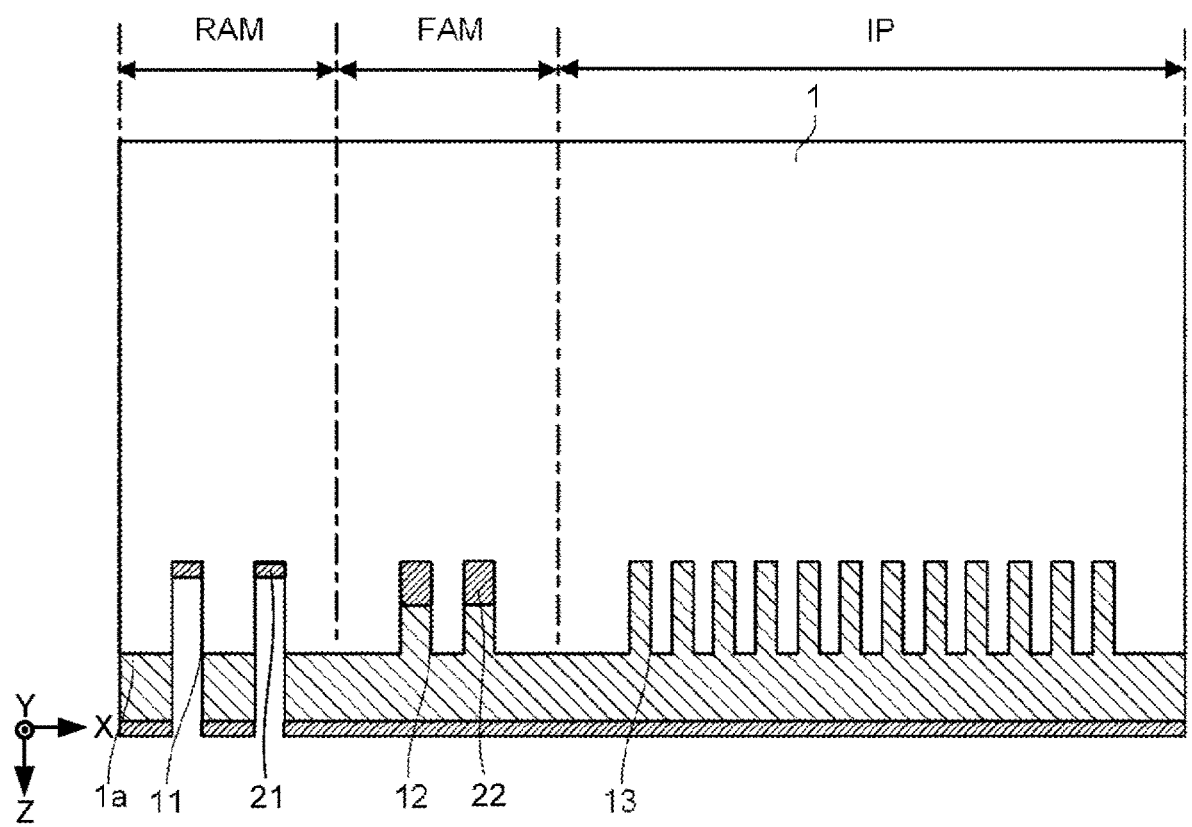
FIG. 19 is a schematic cross-sectional view illustrating the optical layer forming step S3-2B according to at least one embodiment.

FIGS. 18 and 19 are schematic cross-sectional views illustrating the optical layer forming step S3-2B and illustrate a part of the X-Z cross-section of the base material 1. By the optical layer forming step S3-2B, as illustrated in FIG. 18, a mask layer 32 such as a photoresist is formed on the surface 1a of the base material 1 by photolithography to cover the fine alignment mark FAM and the imprint pattern IP. Then, as illustrated in FIG. 19, the second material is deposited in the recess 11 by, for example, sputtering to form the optical layer 21. The mask layer 32 is removed after the optical layer 21 is formed.

The optical layer forming step S3-2B may be provided before the optical layer forming step S3-2A. That is, the optical layer 22 is formed before or after the optical layer 21 is formed. In the optical layer forming step S3-2B, the fine alignment mark FAM is exposed to deposit the second material in the recesses 11 and 12. Then, the optical layer 21 and the optical layer 22 may be formed by further depositing the second material in the recess 12 in the optical layer forming step S3-2A.

As described above, the template of the third embodiment includes the base material 1 having the rough alignment mark RAM including the first pattern and the fine alignment mark FAM including the second pattern, the optical layer 21 provided in the recess 11 of the first pattern, and the optical layer 22 provided in the recess 12 of the second pattern and thicker than the optical layer 21.

As the imprint pattern IP is miniaturized, the patterns of the rough alignment mark RAM and the fine alignment mark FAM are also miniaturized. Due to the above miniaturization, the optical layer having a thickness of 2 nm to 3 nm in the related art may cause a decrease in the intensity of the detection signal by the optical detector. In particular, when the intensity of the detection signal of the fine alignment mark FAM is reduced, the precision of fine alignment between the template and the target is significantly reduced.

In contrast, by making the optical layer 22 thicker than the thickness of the related art, it is possible to prevent a decrease in the intensity of the detection signal of the fine alignment mark FAM. Further, by setting the depth D2 of the recess 12 to be the same as the depth D1 of the recess 11, it is possible to prevent an erroneous detection of the position of the fine alignment mark FAM. Therefore, the accuracy of alignment between the target and the template may be improved.

The present embodiment may be combined with any of the other embodiments as appropriate.

Fourth Embodiment

Figure 20:
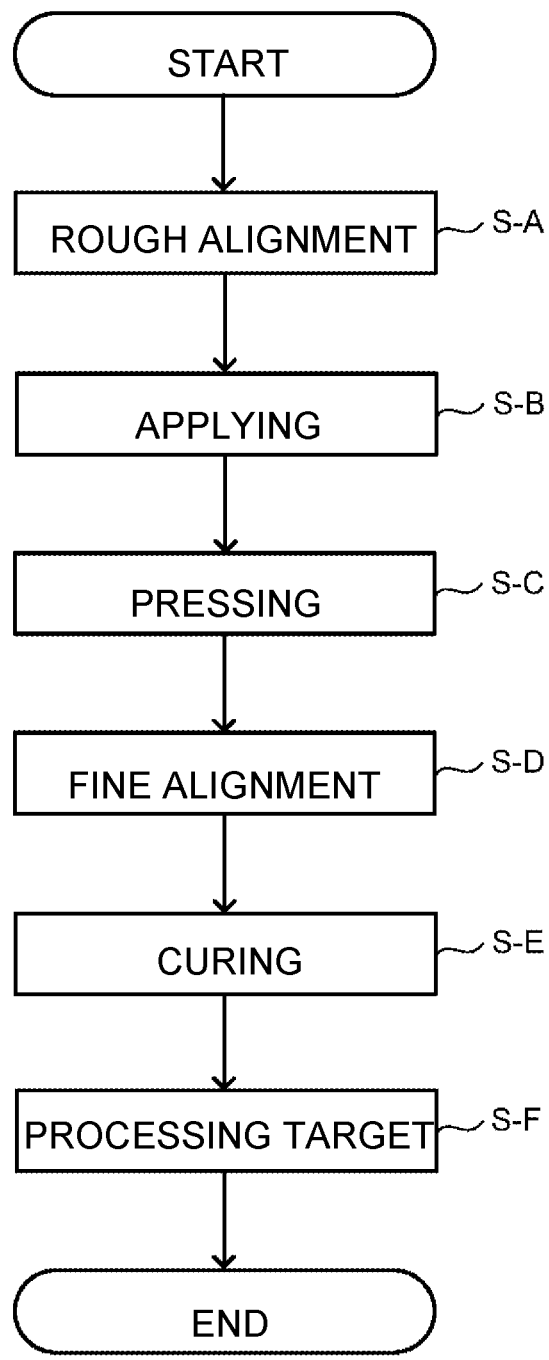
FIG. 20 is a flowchart of an example of a method for manufacturing a semiconductor device using NIL according to at least one embodiment.

FIG. 20 is a flowchart of an example of a method for manufacturing a semiconductor device using NIL. An example of the semiconductor device manufacturing method includes a rough alignment step S-A, a coating step S-B, a pressing step S-C, a fine alignment step S-D, a curing step S-E, and a target processing step S-F.

Figure 21:
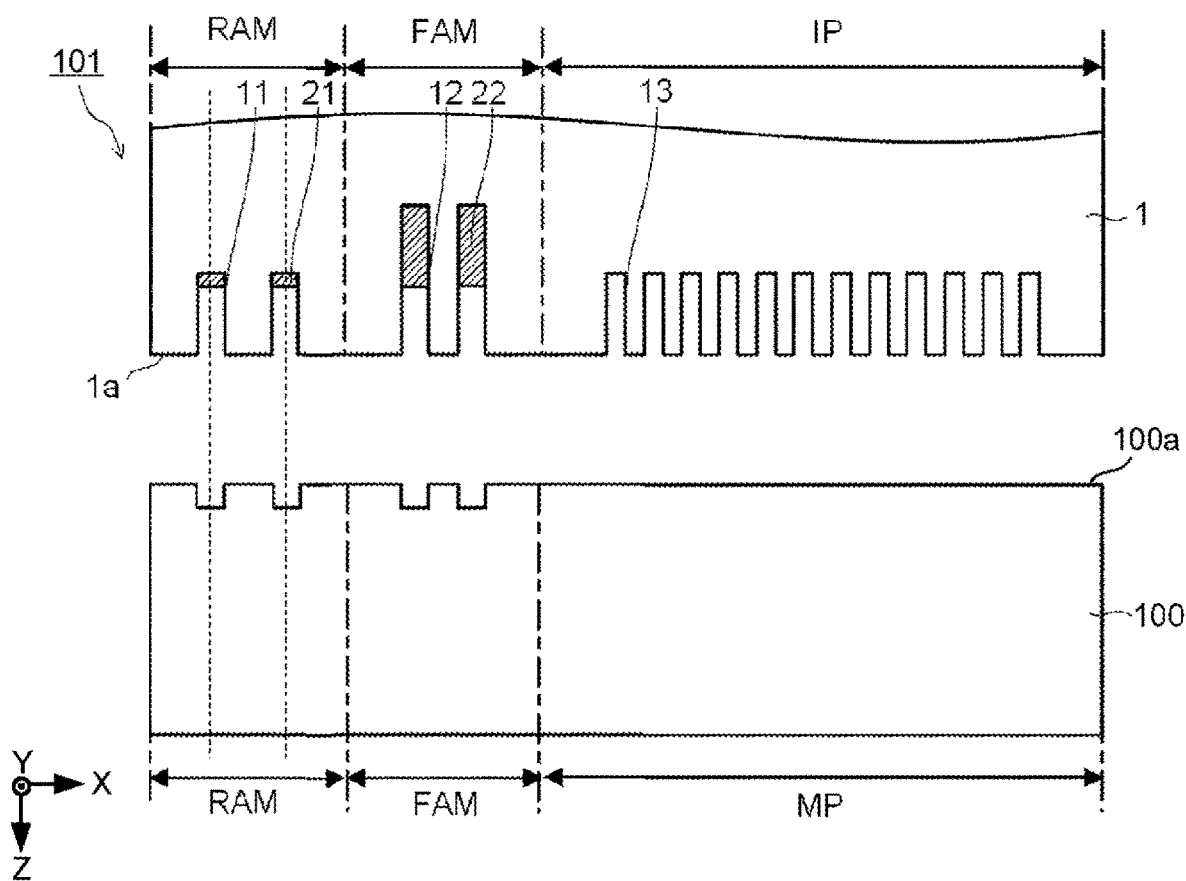
FIG. 21 is a schematic cross-sectional view illustrating an example of a rough alignment step S-A according to at least one embodiment.

FIG. 21 is a schematic cross-sectional view illustrating an example of the rough alignment step SA and illustrates a part of the X-Z cross-section of the base material 1. FIG. 21 schematically illustrates the target 100 and the template 101. In the rough alignment step S-A, the pattern forming surface of the template 101 and the processed surface 100a of the target 100 face each other, and the position of the first pattern (rough alignment mark RAM) of the template 101 is aligned with the position of the rough alignment mark RAM of the target 100. These positions are adjusted by detecting the respective positions using, for example, an optical detector such as an image sensor and relatively moving the template 101 and the target 100 using, for example, a stage and a stage moving mechanism.

The target 100 is, for example, a stacked body formed by stacking a plurality of films on a semiconductor substrate. The target 100 has a rough alignment mark RAM, a fine alignment mark FAM, and a main pattern MP. The configuration of the target 100 is not particularly limited.

The template 101 is one of the templates of the first to third embodiments. FIG. 21 illustrates an example of the template of the first embodiment as an example.

Figure 22:
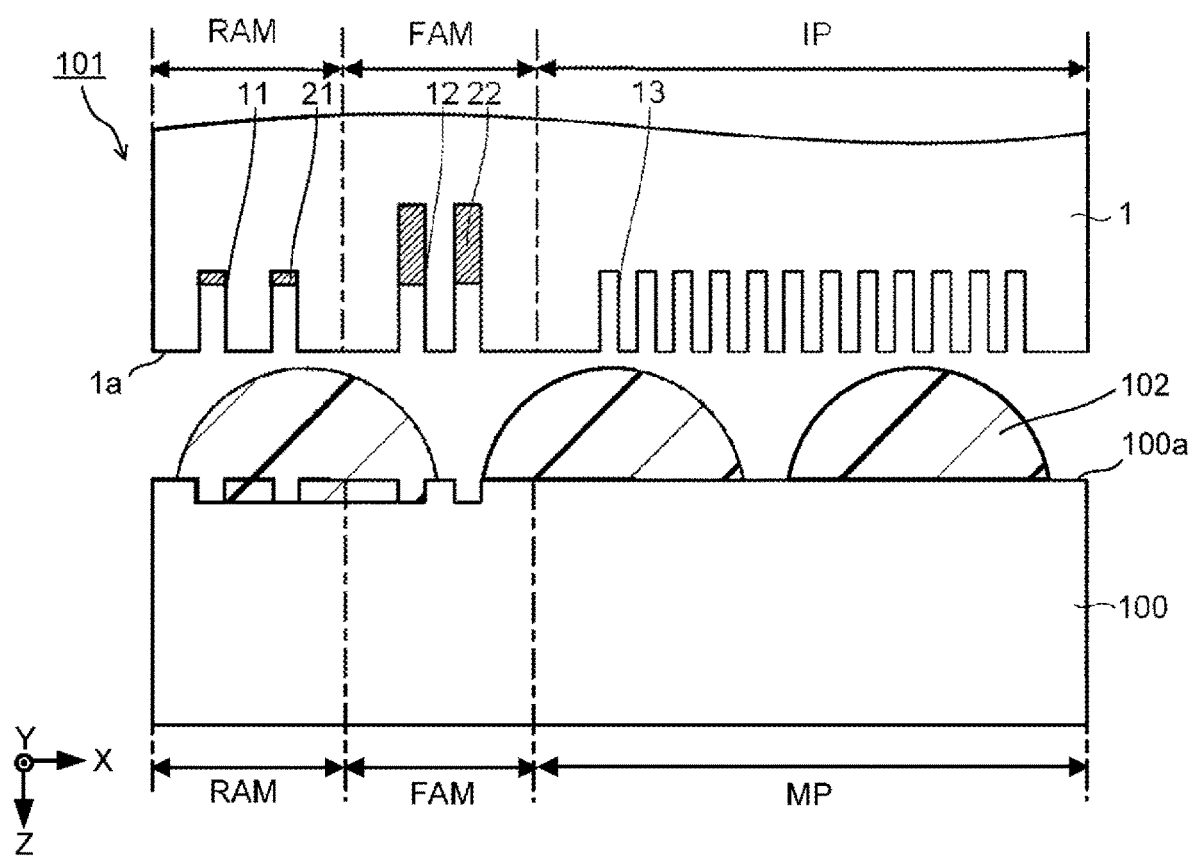
FIG. 22 is a schematic cross-sectional view illustrating an example of coating step S-B according to at least one embodiment.

FIG. 22 is a schematic cross-sectional view illustrating an example of the coating step S-B, and illustrates a part of the X-Z cross-section of the base material 1. In the coating step S-B, the imprint material is coated on the processed surface 100a to form the layer 102. The imprint material contains a photocurable resin, such as a photoresist. The imprint material is applied by, for example, dropping or spin coating.

Figure 23:
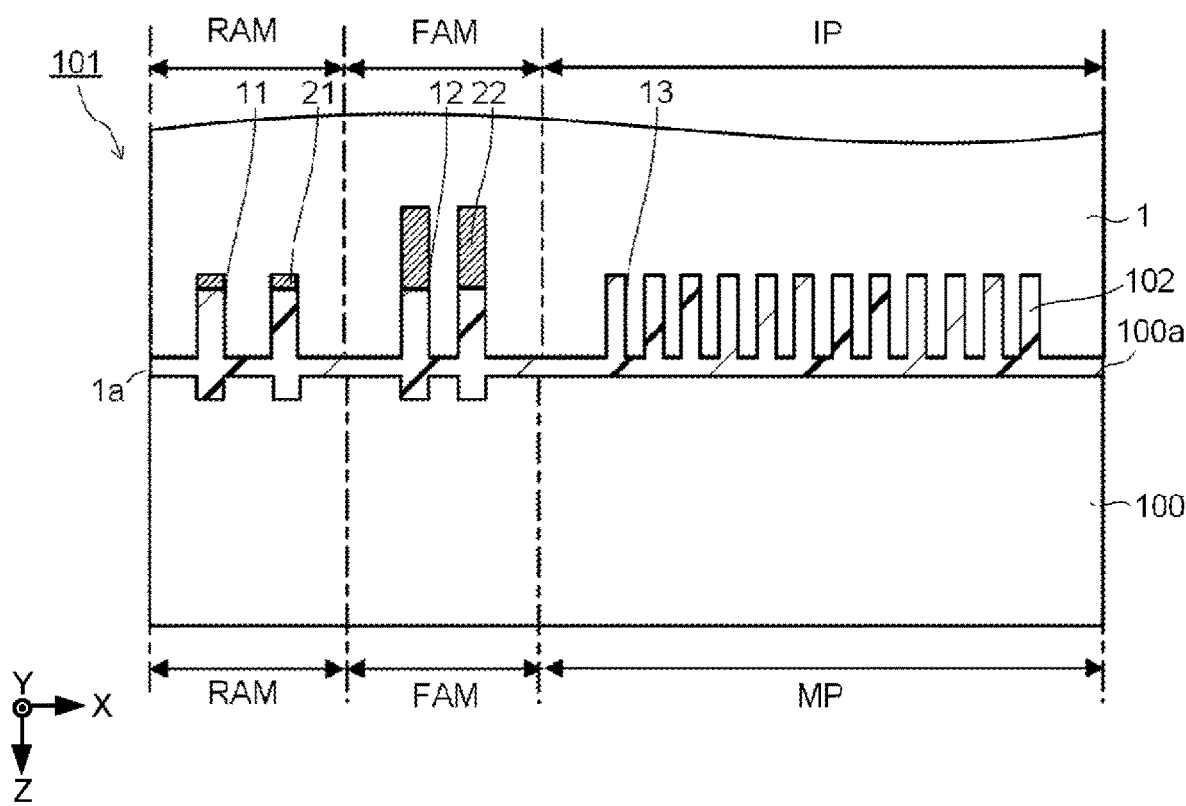
FIG. 23 is a schematic cross-sectional view illustrating an example of a pressing step S-C according to at least one embodiment.

FIG. 23 is a schematic cross-sectional view illustrating an example of the pressing step SC and illustrates a part of the X-Z cross-section of the base material 1. In the pressing step S-C, the template 101 is pressed against the layer 102 to pattern the layer 102. The template 101 is pressed by relatively moving the template 101 and the target 100 using, for example, a stage and a stage moving mechanism. The layer 102 is patterned according to the shape of the pattern formation surface of the template 101. Further, a part of the layer 102 also fills the recesses 11 and 12.

Figure 24:
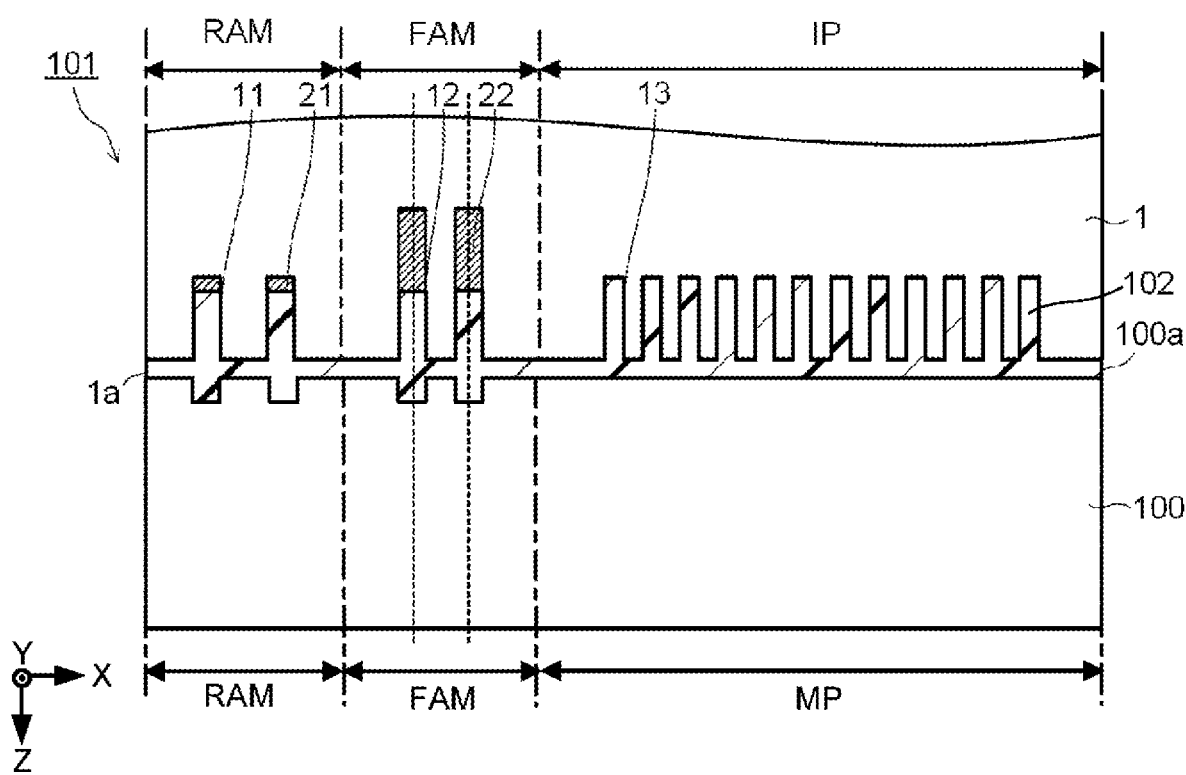
FIG. 24 is a schematic cross-sectional view illustrating an example of a fine alignment step S-D according to at least one embodiment.

FIG. 24 is a schematic cross-sectional view illustrating an example of the fine alignment step S-D and illustrates a part of the X-Z cross-section of the base material 1. By the fine alignment step S-D, the position of the second pattern (fine alignment mark FAM) of the template 101 and the position of the fine alignment mark FAM of the target 100 are aligned. These positions are adjusted by detecting the respective positions using, for example, an optical detector such as an image sensor, and relatively moving the template 101 and the target 100 using, for example, a stage and a stage moving mechanism.

Figure 25:
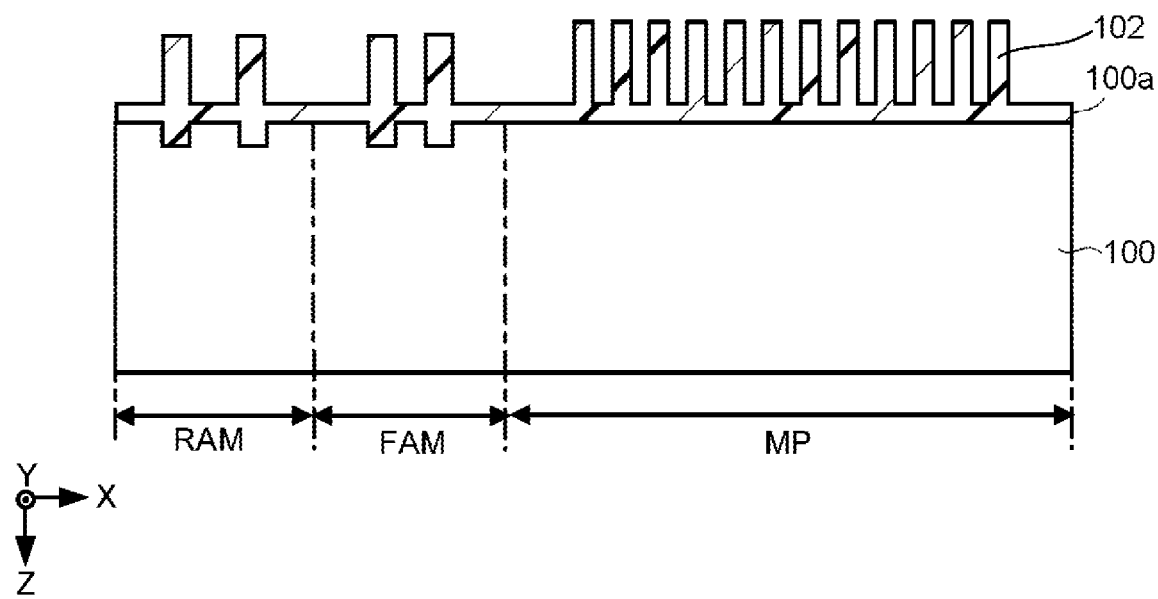
FIG. 25 is a schematic cross-sectional view illustrating an example of a curing step S-E according to at least one embodiment.

FIG. 25 is a schematic cross-sectional view illustrating an example of the curing step S-E and illustrates a part of the X-Z cross-section of the base material 1. The imprint pattern IP is transferred to the layer 102 by curing the patterned layer 102 in the curing step S-E. At this time, the first pattern and the second pattern are also transferred to the layer 102. When the imprint pattern IP has, for example, convex portions, the cured layer 102 has recesses.

When the layer 102 contains a photocurable resin, the layer 102 is cured by irradiating light through the template 101. The template 101 is separated from the layer 102 after the layer 102 is cured.

Figure 26:
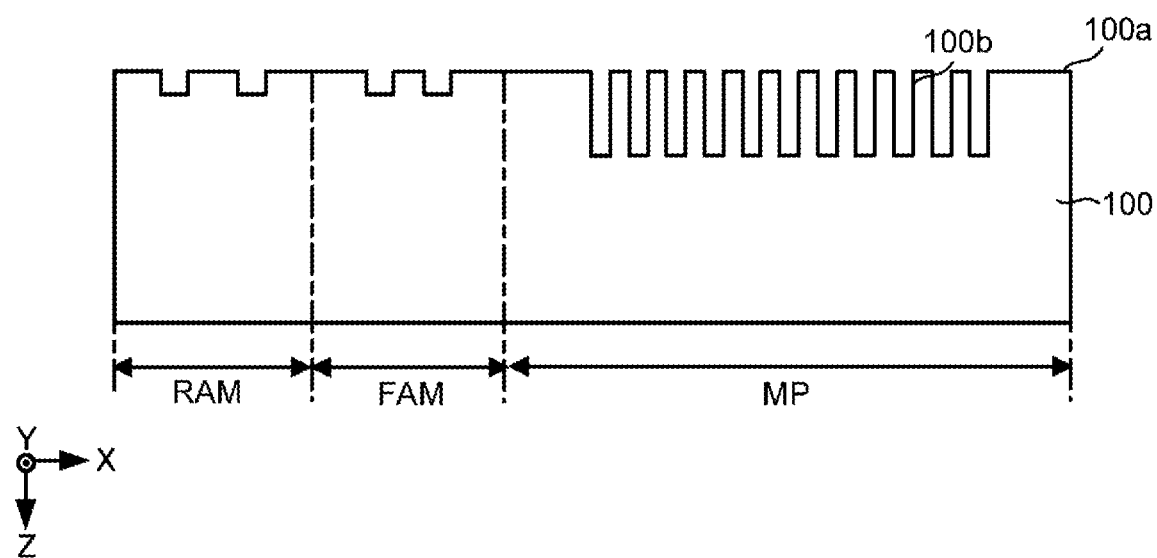
FIG. 26 is a schematic cross-sectional view illustrating an example of a target processing step S-F according to at least one embodiment.

FIG. 26 is a schematic cross-sectional view illustrating an example of the target processing step S-F. By the target processing step S-F, a part of the target 100 is processed using the layer 102 as a mask to form, for example, an opening 100b. After the opening 100b is formed, the layer 102 is removed.

The opening 100b may be, for example, a groove for forming a buried wiring layer. The target 100 is processed by partially removing the stack constituting the target 100 by, for example, dry etching. The shape of the processed target 100 is determined according to the shapes of the rough alignment mark RAM, the fine alignment mark FAM, and the imprint pattern IP. Further, by forming a mask layer over the layer 102 to cover a part of the target 100 and processing another part of the target 100, it is possible to form the opening 100b while the rough alignment mark RAM and the fine alignment mark FAM of the target 100 remain.

As described above, in the example of the method for manufacturing the semiconductor device of the at least one embodiment, the rough alignment and the fine alignment between the template and the target are performed using one of the templates of the first to third embodiments. Thus, as described above, the accuracy of alignment between the target and the template may be improved.

While certain embodiments have been described, these embodiments have been presented by way of example only, and are not intended to limit the scope of the disclosure. Indeed, the novel embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A template comprising:
   a base material having a surface including a first pattern and a second pattern, the first pattern including a first recess, the second pattern including a second recess, the base material containing a first material having a first refractive index;
   a first layer disposed in the first recess and containing a second material, the second material having a second refractive index different from the first refractive index; and
   a second layer disposed in the second recess, containing a third material, the third material having a third refractive index different from the first refractive index and the second layer being thicker than the first layer, wherein the first material, the second material and the third material are solid materials.

2. The template according to claim 1, wherein a depth of the second recess from the surface is greater than a depth of the first recess from the surface.

3. The template according to claim 2, wherein an exposed surface of the second layer is flush with an exposed surface of the first layer.

4. The template according to claim 1, wherein a depth of the second recess from the surface is equal to a depth of the first recess from the surface.

5. The template according to claim 1, wherein a width of the second recess is greater than a width of the first recess.

6. The template according to claim 1, wherein the surface has a rough alignment mark and a fine alignment mark, the rough alignment mark including the first pattern, the fine alignment mark including the second pattern.

7. The template according to claim 1, wherein the surface further has a third pattern different from the first pattern and the second pattern.

8. The template according to claim 1, wherein the first material includes quartz and the second material includes chromium.

9. A method of manufacturing a semiconductor device, the method comprising:
- causing a pattern forming surface of the template according to claim 1 and a processed surface of a target to face each other;
- aligning a position of the first pattern of the template with a position of a first alignment mark of the target;
- applying an imprint material on the processed surface to form a layer;
- pressing the template against the layer to pattern the layer forming a patterned layer;
- aligning a position of the second pattern of the template with a position of a second alignment mark of the target;
- curing the patterned layer; and
- processing a portion of the target using the cured layer.

10. A method of manufacturing a template, the method comprising:
- forming a first pattern and a second pattern on a surface of a base material, the first pattern including a first recess, the second pattern including a second recess, the base material containing a first material having a first refractive index; and
- forming a first layer in the first recess, and a second layer in the second recess, the first layer containing a second material having a second refractive index different from the first refractive index, the second layer containing a third material, the third material having a third refractive index different from the first refractive index and the second layer being thicker than the first layer, wherein the first material, the second material and the third material are solid materials.

11. The method according to claim 10, wherein the second pattern is formed before or after forming the first pattern.

12. The method according to claim 10, wherein the second layer is formed before or after forming the first layer.

13. The method according to claim 10, wherein a depth of the second recess from the surface is greater than a depth of the first recess from the surface.

14. The method according to claim 13, wherein an exposed surface of the second layer is flush with an exposed surface of the first layer.

15. The method according to claim 10, wherein a depth of the second recess from the surface is equal to a depth of the first recess from the surface.

16. The method according to claim 10, wherein a width of the second recess is greater than a width of the first recess.

17. The method according to claim 10, wherein the first pattern forms a rough alignment mark and the second pattern forms a fine alignment mark.

18. The method according to claim 10, further comprising forming a third pattern on the surface together with the first pattern, the third pattern being different from the first pattern and the second pattern.

19. The method according to claim 10, wherein the first material includes quartz and the second material includes chromium.

20. The method according to claim 10, wherein the first and second layers are formed in a same step.

* * * * *